(12) United States Patent
Zhu

(10) Patent No.: US 10,741,622 B2
(45) Date of Patent: Aug. 11, 2020

(54) METHOD OF FABRICATING ORGANIC LIGHT EMITTING DIODE DISPLAY SUBSTRATE USING A PROTRUDING LAYER ENCIRCLING A SUBPIXEL REGION

(71) Applicants: BOE TECHNOLOGY GROUP CO., LTD., Beijing (CN); HEFEI XINSHENG OPTOELECTRONICS TECHNOLOGY CO., LTD., Hefei, Anhui (CN)

(72) Inventor: Ruhui Zhu, Beijing (CN)

(73) Assignees: BOE TECHNOLOGY GROUP CO., LTD., Beijing (CN); HEFEI XINSHENG OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 0 days.

(21) Appl. No.: 15/741,743

(22) PCT Filed: Jun. 29, 2017

(86) PCT No.: PCT/CN2017/090688
§ 371 (c)(1),
(2) Date: Jan. 3, 2018

(87) PCT Pub. No.: WO2018/107722
PCT Pub. Date: Jun. 21, 2018

(65) Prior Publication Data
US 2018/0337221 A1    Nov. 22, 2018

(30) Foreign Application Priority Data

Dec. 16, 2016  (CN) .......................... 2016 1 1176024

(51) Int. Cl.
*H01L 27/32*    (2006.01)
*H01L 27/12*    (2006.01)
(Continued)

(52) U.S. Cl.
CPC ...... *H01L 27/3246* (2013.01); *H01L 27/1288* (2013.01); *H01L 27/3262* (2013.01);
(Continued)

(58) Field of Classification Search
CPC ............ H01L 27/3246; H01L 27/1288; H01L 51/0011; H01L 27/32; H01L 27/12; H01L 51/56; H01L 51/00; H01L 51/52
(Continued)

(56) References Cited

U.S. PATENT DOCUMENTS

2005/0093441 A1* 5/2005 Uhlig .................. H01L 27/3246
                                                            313/506
2006/0214195 A1   9/2006 Kobayashi et al.
(Continued)

FOREIGN PATENT DOCUMENTS

CN    103456765 A    12/2013
CN    103794634 A    5/2014
(Continued)

OTHER PUBLICATIONS

International Search Report & Written Opinion dated Oct. 13, 2017, regarding PCT/CN2017/090688.
(Continued)

*Primary Examiner* — Lex H Malsawma
*Assistant Examiner* — Eric W Jones
(74) *Attorney, Agent, or Firm* — Intellectual Valley Law, P.C.

(57) ABSTRACT

The present application discloses a method of fabricating an organic light emitting diode display substrate having a subpixel region and an inter-subpixel region. The method includes forming a pixel definition layer on the base substrate, the pixel definition layer being formed in the inter-subpixel region and defining the subpixel region of the organic light emitting diode display substrate; forming an
(Continued)

insulating dielectric layer on a side of the pixel definition layer distal to the base substrate, the insulating dielectric layer being formed to define a first aperture region greater than the subpixel region; and, subsequent to forming the insulating dielectric layer, forming an organic light emitting layer in each subpixel region using a mask plate placed on the insulating dielectric layer.

18 Claims, 6 Drawing Sheets

(51) Int. Cl.
  *H01L 51/56* (2006.01)
  *H01L 51/00* (2006.01)
  *H01L 51/52* (2006.01)
(52) U.S. Cl.
  CPC ...... *H01L 51/0011* (2013.01); *H01L 51/5206* (2013.01); *H01L 51/5221* (2013.01); *H01L 51/56* (2013.01)
(58) Field of Classification Search
  USPC ....................................... 438/99; 257/40, 59
  See application file for complete search history.

(56) References Cited

U.S. PATENT DOCUMENTS

| | | | |
|---|---|---|---|
| 2010/0207107 A1* | 8/2010 | Kim | ................... H01L 51/525 257/40 |
| 2011/0159201 A1 | 6/2011 | Park et al. | |
| 2015/0069335 A1 | 3/2015 | Hsu | |
| 2015/0076458 A1* | 3/2015 | Lee | ................... H01L 51/56 257/40 |
| 2015/0236080 A1* | 8/2015 | Cho | ................... H01L 27/3246 257/40 |

FOREIGN PATENT DOCUMENTS

| | | |
|---|---|---|
| CN | 105845711 A | 8/2016 |
| CN | 106206604 A | 12/2016 |
| CN | 106384744 A | 2/2017 |
| CN | 206225365 U | 6/2017 |
| JP | 2006269963 A | 10/2006 |

OTHER PUBLICATIONS

Notice of Allowance in the Korean Patent Application No. 20187000613, dated Jul. 21, 2018; English translation attached.

* cited by examiner

METHOD OF FABRICATING ORGANIC LIGHT EMITTING DIODE DISPLAY SUBSTRATE USING A PROTRUDING LAYER ENCIRCLING A SUBPIXEL REGION

CROSS-REFERENCE TO RELATED APPLICATION

This application is a national stage application under 35 U.S.C. § 371 of International Application No. PCT/CN2017/090688, filed Jun. 29, 2017, which claims priority to Chinese Patent Application No. 201611176024.8, filed Dec. 16, 2016, the contents of which are incorporated by reference in the entirety.

TECHNICAL FIELD

The present invention relates to display technology, more particularly, to an organic light emitting diode display substrate, an organic light emitting diode display apparatus, and a method of fabricating an organic light emitting diode display substrate.

BACKGROUND

Organic light emitting diode (OLED) display apparatuses are self-emissive devices, and do not require backlights. OLED display apparatuses also provide more vivid colors and a larger color gamut as compared to the conventional liquid crystal display (LCD) apparatuses. Further, OLED display apparatuses can be made more flexible, thinner, and lighter than a typical LCD.

SUMMARY

In one aspect, the present invention provides a method of fabricating an organic light emitting diode display substrate having a subpixel region and an inter-subpixel region, comprising forming a pixel definition layer on the base substrate, the pixel definition layer being formed in the inter-subpixel region and defining the subpixel region of the organic light emitting diode display substrate; forming an insulating dielectric layer on a side of the pixel definition layer distal to the base substrate, the insulating dielectric layer being formed to define a first aperture region greater than the subpixel region; and, subsequent to forming the insulating dielectric layer, forming an organic light emitting layer in each subpixel region using a mask plate placed on the insulating dielectric layer; wherein the pixel definition layer and the insulating dielectric layer are formed so that a projection of the first aperture region on the base substrate covers that of the subpixel region; the mask plate has a plurality of apertures, an edge of each of the plurality of apertures surrounding a subpixel region; and a portion of the mask plate in the first aperture, region and surrounding the subpixel region is spaced apart by a gap from a portion of the pixel definition layer in the first aperture region and surrounding the subpixel region.

Optionally, the gap has a thickness substantially the same as that of the insulating dielectric layer.

Optionally, prior to forming the organic light emitting layer, the method further comprises forming a protrusion layer comprising a plurality of protruding portions in the inter-subpixel region, each of the plurality of protruding portions being formed to substantially encircle a subpixel region; wherein each of the plurality of protruding portions is formed to be spaced apart from the insulating dielectric layer; and a height of the protrusion layer relative to the base substrate is less than that of the insulating dielectric layer.

Optionally, each of the plurality of protruding portions is formed to define a second aperture region; the projection of the first aperture region on the base substrate covers that of the second aperture region; and a projection of the second aperture region on the base substrate substantially overlaps with that of the subpixel region encircled by one of the plurality of protruding portions.

Optionally, a width of the first aperture region is greater than a width of the subpixel region by at least 1 $\mu$m.

Optionally, the pixel definition layer and the insulating dielectric layer are formed in a single process using a same material and a same mask plate.

Optionally, the pixel definition layer and the protrusion layer are formed in a single process using a same material and a same mask plate.

Optionally, the insulating dielectric layer and the protrusion layer are formed in a single process using a same material and a same mask plate.

Optionally, the pixel definition layer, the insulating dielectric layer, and the protrusion layer are formed in a single process using a same material and a same mask plate.

Optionally, the method further comprises forming a thin film transistor in the inter-subpixel region; forming a first electrode on the base substrate; forming an organic layer on a side of the first electrode distal to the base substrate; and forming a second electrode on a side of the organic layer distal to the first electrode; wherein forming the thin film transistor comprises forming a drain electrode; and the drain electrode is formed to be electrically connected to the first electrode of the organic light emitting diode.

In another aspect, the present, invention provides an organic light emitting diode display substrate having a subpixel region and an inter-subpixel region, comprising a base substrate; a pixel definition layer in the inter-subpixel region and defining the subpixel region of the organic light emitting diode display substrate; and an insulating dielectric layer on a side of the pixel definition layer distal to the base substrate, defining a first aperture region greater than the subpixel region; wherein a projection of the first aperture region on the base substrate covers that of the subpixel region.

Optionally, the insulating dielectric layer abuts the pixel definition layer.

Optionally, the insulating dielectric layer is an integral portion of the pixel definition layer.

Optionally, the organic light emitting diode display substrate further comprises a protrusion layer comprising a plurality of protruding portions in the inter-subpixel region, each of the plurality of protruding portions substantially encircling a subpixel region; each of the plurality of protruding portions is spaced apart from the insulating dielectric layer; and a height of the protrusion layer relative to the base substrate is less than that of the insulating dielectric layer.

Optionally, each of the plurality of protruding portions defines a second aperture region; a projection of the first aperture region on the base substrate covers that of the second aperture region; and a projection of the second aperture region on the base substrate substantially overlaps with that of the subpixel region encircled by one of the plurality of protruding portions.

Optionally, the protrusion layer abuts the pixel definition layer.

Optionally, the protrusion layer is an integral portion of the pixel definition layer.

Optionally, the organic light emitting diode display substrate further comprises a thin film transistor in the inter-subpixel region and an organic light emitting diode; wherein the organic light emitting diode comprises a first electrode on the base substrate; an organic layer on a side of the first electrode distal to the base substrate; a second electrode on a side of the organic layer distal to the first electrode and the organic layer comprises an organic light, emitting layer; wherein the thin film transistor comprises a drain electrode electrically connected to the first electrode of the organic light emitting diode.

Optionally, the insulating dielectric layer has a thickness in a range of approximately 1 µm to approximately 5 µm.

In another aspect, the present invention provides an organic light emitting diode display apparatus comprising the organic light emitting diode display substrate described herein.

BRIEF DESCRIPTION OF THE FIGURES

The following drawings are merely examples for illustrative purposes according to various disclosed embodiments and are not intended to limit the scope of the present invention.

FIG. 4B is schematic diagram illustrating the structure of an insulating dielectric layer is some embodiments according to the present disclosure.

FIG. 6B is schematic diagram illustrating the structure of one of a plurality of protruding portions in some embodiments according to the present disclosure.

DETAILED DESCRIPTION

The disclosure will now be described more specifically with reference to the following embodiments. It is to be noted that the following descriptions of some embodiments are presented herein for purpose of illustration and description only. It is not intended to be exhaustive or to be limited to the precise form disclosed.

Figure 1:
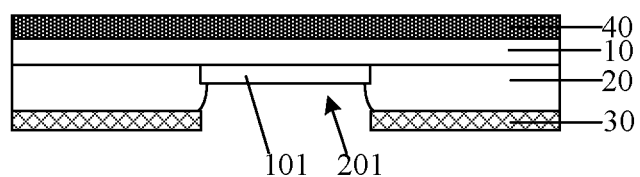
FIG. 1 is a schematic diagram illustrating a substrate used in fabrication of a conventional organic light emitting diode display substrate.
Figure 2:
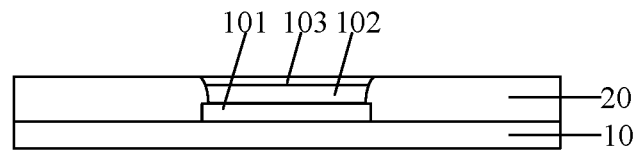
FIG. 2 is a schematic diagram illustrating the structure of a conventional organic light emitting diode display substrate.

FIG. 1 is a schematic diagram illustrating a substrate used in fabrication of a conventional organic light emitting diode display substrate. FIG. 2 is a schematic diagram illustrating the structure of a conventional organic light emitting diode display substrate. In the conventional organic light emitting diode display substrate fabricating process, a first electrode 101 (e.g., an anode) is formed on the base substrate 10, and a pixel definition layer 20 is then formed on a side of the first electrode 101 distal to the base substrate 10. Subsequently, a metal mask plate 30 is placed on the pixel definition layer 20. Apertures of the mask plate 30 are aligned with those of the pixel definition layer 20, e.g., the subpixel regions 201. Organic materials are vapor-deposited onto the substrate to form an organic layer 102, and an electrode material is vapor-deposited onto the substrate to form a second electrode 103 (e.g., a cathode).

To avoid shadowing effects caused by overflow of vapor-deposited organic materials, the mask plate 30 is kept as close to the substrate as possible. Typically, as shown in FIG. 1, a magnet 40 is place on a side of the base substrate 10 to adhere the mask plate 30 onto the pixel definition layer 20.

The metal mask plate 30 is prone to deformation, which typically results in ragged edges of the mask plate 30. When the mask plate 30 is adhered to the pixel definition layer 20, the ragged edges are pressed upon the edges of the pixel definition layer 20, resulting in damages along the edges of the pixel definition layer 20 (e.g., collapse of the edges of the pixel definition layer 20), in turn leading to defects in the organic light emitting diode. Moreover, when the mask plate 30 is moved onto or away from the substrate, the movement easily causes scratches on the edges of the organic light emitting diode, resulting in dead spots in the organic light emitting diode. Further, during the vapor deposition process, various organic or inorganic materials are prone to condense along the edges of the apertures of the mask plate 30, forming particles. These particles can press on the organic light emitting diode, resulting in additional damages.

Accordingly, the present disclosure provides, inter alia, an organic light emitting diode display substrate, an organic light emitting diode display apparatus, and a method of fabricating an organic light emitting diode display substrate that substantially obviate one or more of the problems due to limitations and disadvantages of the related art. In one aspect, the present disclosure provides an organic light emitting diode display substrate having a subpixel region and an inter-subpixel region. In some embodiments, the organic light emitting diode display substrate includes a base substrate; a pixel definition layer in the inter-subpixel region and defining the subpixel region of the organic light emitting diode display substrate; and an insulating dielectric layer on a side of the pixel definition layer distal to the base substrate, defining a first aperture region. Optionally, a projection of the first aperture region on the base substrate covers that of the subpixel region. In another aspect, the present disclosure provides a method of fabricating an organic light emitting diode display substrate having a subpixel region and an inter-subpixel region. In some embodiments, the method includes forming a pixel definition layer on the base substrate, the pixel definition layer being formed in the inter-subpixel region and defining the subpixel region of the organic light emitting diode display substrate; forming an insulating dielectric layer on a side of the pixel definition layer distal to the base substrate, the insulating dielectric layer being formed to define a first aperture region greater than the subpixel region; subsequent to forming the insulating dielectric layer, forming an organic light emitting layer in each subpixel region using a mask plate placed on the insulating dielectric layer. Optionally, the pixel definition layer and the insulating dielectric layer are formed so that a projection of the first aperture region on the base substrate covers that of the subpixel region; the mask plate has a pattern corresponding to a plurality of organic light emitting diodes; and a portion of the mask plate in the first aperture region and surrounding the subpixel region is spaced apart by a gap from a portion of the pixel definition layer in the first aperture region and surrounding the subpixel region. Optionally, an edge of the mask plate in the first aperture region and surrounding the subpixel region are spaced apart from an edge of the pixel definition layer in the first aperture region and surrounding the subpixel region by a gap.

As used herein, a subpixel region refers to a light emission region of a subpixel, such as a region corresponding to a light emissive layer in an organic light emitting diode display panel, or a region corresponding to a pixel electrode in a liquid crystal display. Optionally, a pixel may include a number of separate light emission regions corresponding to a number of subpixels in the pixel. Optionally, the subpixel region is a light emission region of a red color subpixel. Optionally, the subpixel region is a light emission region of a green color subpixel. Optionally, the subpixel region is a light emission region of a blue color subpixel. Optionally, the subpixel region is a light emission region of a white color subpixel. As used herein, an inter-subpixel region refers to a region between adjacent subpixel regions, such as a region corresponding to a pixel definition layer in an organic light emitting diode display panel, or a region corresponding to a black matrix in a liquid crystal display. Optionally, the inter-subpixel region is a region between adjacent subpixel regions in a same pixel. Optionally, the inter-subpixel region is a region between two adjacent subpixel regions from two adjacent pixels. Optionally, the inter-subpixel region is a region between a subpixel region of a red color subpixel and a subpixel region of an adjacent green color subpixel. Optionally, the inter-subpixel region is a region between a subpixel region of a red color subpixel and a subpixel region of an adjacent blue color subpixel. Optionally the inter-subpixel region is a region between a subpixel region of a green color subpixel and a subpixel region of an adjacent blue color subpixel.

Figure 3:
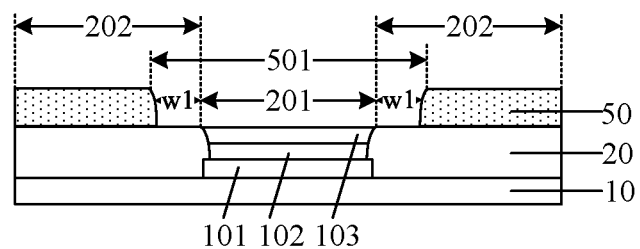
FIG. 3 is schematic diagram illustrating the structure of an organic light emitting diode display substrate in some embodiments according to the present disclosure.

FIG. 3 is schematic diagram illustrating the structure of an organic light emitting diode display substrate in some embodiments according to the present disclosure. Referring to FIG. 3, the organic light emitting diode display substrate in some embodiments has a subpixel region 201 and an inter-subpixel region 202. The organic light emitting diode display substrate in some embodiments includes a base substrate 10, a pixel definition layer 20 in the inter-subpixel region 202 and defining the subpixel region 201 of the organic light emitting diode display substrate, and an insulating dielectric layer 50 on a side of the pixel definition layer 20 distal to the base substrate 10, defining a first aperture region 501 greater than the subpixel region 201. A projection of the first aperture region 501 on the base substrate 10 covers that of the subpixel region 201. A projection of the pixel definition layer 20 on the base substrate 10 covers that of the insulating dielectric layer 50. As shown in FIG. 3, a width of the first aperture region 501 is greater than a width of the subpixel region 201. An edge of the pixel definition layer 20 surrounding the subpixel region 201 extends over an edge of the insulating dielectric layer 50 surrounding the first aperture region 501 by a width w1, as shown in FIG. 3. Optionally, the width of the first aperture region 501 is greater than a width of the subpixel region 201 by at least 1 µm.

In some embodiments, the organic light emitting diode includes a first electrode 101, an organic layer 102, and a second electrode 103. Optionally, the organic layer 102 includes an organic light emitting, layer. Optionally, the first electrode 101 is an anode of the organic light emitting diode, and the second electrode 103 is a cathode of the organic light emitting diode. Optionally, the first electrode 101 is a cathode of the organic light emitting diode, and the second electrode 103 is an anode of the organic light emitting diode. Optionally, the portions of the first electrode 101, the organic layer 102, and the second electrode 103 in the subpixel region 201 constitute the organic light emitting diode. Optionally, the second electrode 103 is an integral electrode (e.g., an integral cathode) for a plurality of organic light emitting diodes, thus is not limited to the subpixel region 201. Optionally, the first electrode 101 is an integral electrode for a plurality of organic light emitting diodes, thus is not limited to the subpixel region 201.

Optionally, the insulating dielectric layer 50 abuts the pixel definition layer 20. Optionally, the insulating dielectric layer 50 is an integral portion of the pixel definition layer 20, e.g., the insulating dielectric layer 50 and the pixel definition layer 20 are formed using a same material, using a same mask plate, and forming in a single process.

Figure 4:
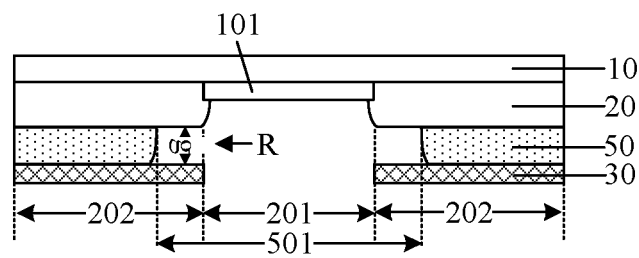
FIG. 4 is schematic diagram illustrating a process of fabricating an organic light emitting diode display substrate in some embodiments according to the present disclosure.

FIG. 4 is schematic diagram illustrating a process of fabricating an organic light emitting diode display substrate in some embodiments according to the present disclosure. Referring to FIG. 4, the process in some embodiments includes forming a pixel definition layer 20 on the base substrate 10, the pixel definition layer 20 being formed in the inter-subpixel region 202 and defining the subpixel region 201 of the organic light emitting diode display substrate; forming an insulating dielectric layer 50 on a side of the pixel definition layer 20 distal to the base substrate 10, the insulating dielectric layer 50 being formed to define a first aperture region 501 greater than the subpixel region 201; subsequent to forming the insulating dielectric layer 50, forming an organic light emitting layer in each subpixel region 201 using a mask plate 30 placed on the insulating dielectric layer 50. Optionally, the pixel definition layer 20 and the insulating dielectric layer 50 are formed so that a projection of the first aperture region 501 on the base substrate 10 covers that of the subpixel region 201, and a projection of the pixel definition layer 20 on the base substrate 10 covers that of the insulating dielectric layer 50. The mask plate 30 has a pattern corresponding to a plurality of organic light emitting diodes. As shown in FIG. 4, an edge of the mask plate 30 in the first aperture region 501 and surrounding the subpixel region 201 is spaced apart from an edge of the pixel definition layer 20 in the first aperture region 501 and surrounding the subpixel region 201 by a gap g. For example, the edge of the mask plate 30 in the first aperture region 501 and surrounding the subpixel region 201 is not in contacted with the edge of the pixel definition layer 20 in the first aperture, region 501 and surrounding the subpixel region 201. The mask plate 30 and the pixel definition layer 20 sandwich the insulating dielectric layer 50, forming a recess R between the insulating dielectric layer 50 and the subpixel region 201. Optionally, the gap g has a thickness substantially the same as that of the insulating dielectric layer 50.

Optionally, the step of forming the organic light emitting diode in each subpixel region 201 includes forming a first electrode 101 in the subpixel region 201, forming an organic layer 102 in the subpixel region 201, and forming a second electrode 103 in the subpixel region 201. Optionally, the organic layer 102 is formed by vapor deposition. During the vapor deposition process, the mask plate 30 is adhered to the insulating dielectric layer 50.

Various appropriate insulating materials may be used for making the insulating dielectric layer 50. Examples of appropriate insulating materials include organic insulating materials and inorganic insulating materials. Optionally, the insulating dielectric layer 50 and the pixel definition layer 20 are made of a same material. Optionally, the insulating dielectric layer 50 and the pixel definition layer 20 are made of different materials. The insulating dielectric layer 50 may be made to have any appropriate thickness, e.g., a thickness sufficient to avoid shadowing effects during the vapor deposition process. Optionally, the mask plate 30 is a metal mask plate.

In the present process, an insulating dielectric layer 50 is formed on the pixel definition layer 20 prior to forming the organic light emitting layer using a mask plate, the insulating dielectric layer 50 is formed so that a recess R is formed between the insulating dielectric layer 50 and the subpixel region 201 when a mask plate 30 is placed on the insulating dielectric layer 50, e.g., the edge of the mask plate 30 in the first aperture region 501 and surrounding the subpixel region 201 is not in contacted with the edge of the pixel definition layer 20 in the first aperture region 501 and surrounding the subpixel region 201. By having this design, even if the mask plate 30 is deformed and has a ragged edge, or the mask plate 30 moves relative to the base substrate 10 during or after the vapor deposition process, damages to the layers of the organic light emitting diode can be obviated, because the mask plate 30 is not in contact with, e.g., spaced apart from, the edges of pixel definition layer 20 surrounding the subpixel region 201. Further, damages caused by particles condensed onto the edge of the mask plate cam also be avoided by having this design.

Optionally, the insulating dielectric layer 50 has a thickness in a range of approximately 1 μm to approximately 5 μm to avoid shadowing effects drying the vapor deposition process.

Figure 5:
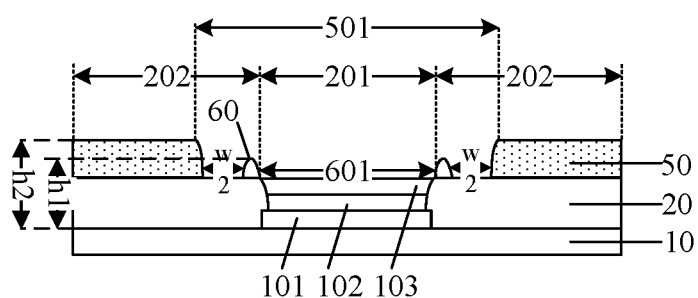
FIG. 5 is schematic diagram illustrating the structure of an organic light emitting diode display substrate in some embodiments according to the present disclosure.

FIG. 5 is schematic diagram illustrating the structure of an organic light emitting diode display substrate in some embodiments according to the present disclosure. Referring to FIG. 5, the organic light emitting diode display substrate in some embodiments further includes a protrusion layer including a plurality of protruding portions 60 in the inter-subpixel region 202, each of the plurality of protruding portions 60 substantially encircling a subpixel region 201. Each of the plurality of protruding portions 60 is spaced apart from the insulating dielectric layer 50 by a distance w2. As shown in FIG. 5, a height h1 of each of the plurality of protruding portions 60 relative to the base substrate 10 is less than a height h2 of the insulating dielectric layer 50 relative to the base substrate 10. The protrusion layer may be made to have any appropriate height. Optionally, each of the plurality of protruding portions 60 has a height such that it is spaced apart from a mask plate 30 placed on the insulating dielectric layer 50. By having this design, the mask plate 30 is not in contact with one of the plurality of protruding portions 60 even if the mask plate 30 is deformed and has a ragged edge.

Figure 6:
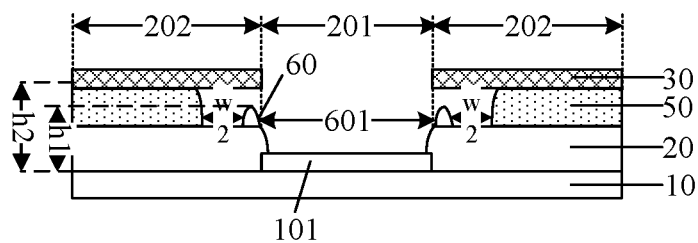
FIG. 6 is schematic diagram illustrating a process of fabricating an organic light emitting diode display substrate in some embodiments according to the present disclosure.

FIG. 6 is schematic diagram illustrating a process of fabricating an organic light emitting diode display substrate in some embodiments according to the present disclosure. Referring to FIG. 6, the process in some embodiments further includes, prior to forming the organic light emitting layer, forming a protrusion layer including a plurality of protruding portions 60 in the inter-subpixel region 202, each of the plurality of protruding portions 60 is formed to substantially encircle a subpixel region 201. As shown in FIG. 6 the respective one of the plurality of protruding portions 60 is formed to be spaced apart from the insulating dielectric layer 50, thereby forming a recess R between the respective one of the plurality of protruding portions 60 and the insulating dielectric 50. Referring to FIG. 6, each of the plurality of protruding portions 60 is formed to be spaced apart from the insulating dielectric layer 50 by a distance w2. A height h1 of each of the plurality of protruding portions 60 relative to the base substrate 10 is less than a height h2 of the insulating dielectric layer 50 relative to the base substrate 10.

By having a protrusion layer including the plurality of protruding portions 60 each encircling a subpixel region 201, the mask plate 30 can be supported by the plurality of protruding portions 60 when the mask plate 30 is deformed and has a ragged edge, avoiding any direct contact between the mask plate 30 and the edges of pixel definition layer 20 surrounding the subpixel region 201. Moreover, the presence of the plurality of protruding portions 60 can prevent contaminating objects accumulated on the mask plate 30 from falling into the subpixel region 201 during the vapor deposition process when the mask plate 30 is placed on the insulating dielectric layer 50.

Referring to FIG. 5, each of the plurality of protruding portions 60 defines a second aperture region 601. A projection of the first aperture region 501 on the base substrate 10 covers that of the second aperture region 601. A projection of the second aperture region 601 on the base substrate 10 substantially overlaps with that of the subpixel region 201 encircled by one of the plurality of protruding portions 60. A projection of the pixel definition layer 20 on the base substrate 10 covers that of the protrusion layer. As shown in FIG. 5, a width of the first aperture region 501 is greater than a width of the second aperture region 601. A width of the first aperture region 501 is greater than a width of the second aperture region 601 by a width w2, as shown in FIG. 5. Optionally, the width of the first aperture region 501 is greater than a width of the second aperture region 601 by at least 1 μm.

Option ally, the protrusion layer abuts the pixel definition layer 20. Optionally, the pixel definition layer 20, the insulating dielectric layer 50, and the protrusion layer are each made of a different material. Optionally, the pixel definition layer 20 and the protrusion layer are made of a same material. Optionally, the pixel definition layer 20 and the insulating dielectric layer 50 are made of a same material. Optionally, the protrusion layer and the insulating dielectric layer 50 are made of a same material. Optionally, the insulating dielectric layer 50 is an integral portion of the pixel definition layer 20, e.g., the insulating dielectric layer 50 and the pixel definition layer 20 are formed using a same material, using a same mask plate, and forming in a single process. Optionally, the protrusion layer is an integral portion of the pixel definition layer 20, e.g., the protrusion layer and the pixel definition layer 20 are formed using a same material, using a same mask plate, and forming in a single process. Optionally, the protrusion layer is an integral portion of the insulating dielectric layer 50, e.g., the protrusion layer and the insulating dielectric layer 50 are formed using a same material, using a same mask plate, and forming in a single process. Optionally, the insulating dielectric layer 50 and the protrusion layer are integral portions of the pixel definition layer 20, e.g., the insulating dielectric layer 50, the protrusion layer, and the pixel definition layer 20 are formed using a same material, using a same mask plate, and forming in a single process.

Various appropriate materials may be used for making the pixel definition layer 20. Examples of appropriate pixel definition materials include various organic materials such as polyimide and phenolic resin.

Various appropriate insulating materials may be used for making the insulating dielectric layer 50. Examples of appropriate insulating materials include organic insulating materials and inorganic insulating materials. Examples of organic insulating materials suitable for making the insulating dielectric layer 50 include polyimide and phenolic resin. Examples of inorganic insulating materials suitable for making the insulating dielectric layer 50 include aluminum oxide ($Al_2O_3$), zinc oxide (ZnO), and titanium dioxide ($TiO_2$).

Various appropriate insulating materials may be used for making the protrusion layer. Examples of appropriate insulating materials include organic insulating materials and inorganic insulating materials. Examples of organic insulating materials suitable for making the protrusion layer include polyimide and phenolic resin. Examples of inorganic insulating materials suitable for making the protrusion layer include aluminum oxide ($Al_2O_3$), zinc oxide (ZnO), and titanium dioxide ($TiO_2$).

Figure 7:
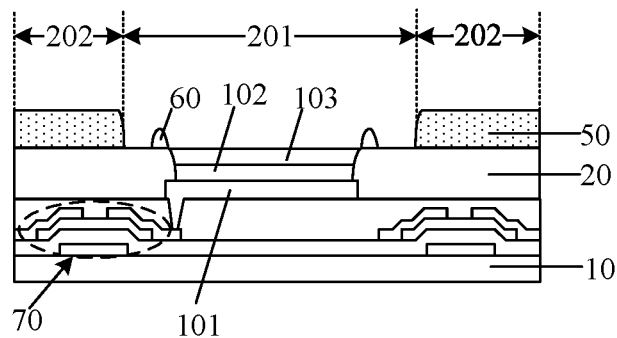
FIG. 7 is schematic diagram illustrating the structure of an organic light emitting diode display substrate in some embodiments according to the present disclosure.

FIG. 7 is schematic diagram illustrating the structure of an organic light emitting diode display substrate in some embodiments according to the present disclosure. Referring to FIG. 7, the organic light emitting diode display substrate in some embodiments further includes a thin film transistor 70 in the inter-subpixel region 202 and an organic light emitting diode in the subpixel region 201. The organic light emitting diode in some embodiments includes a first electrode 101, an organic layer 102, and a second electrode 103. Optionally, the first electrode 101 is electrically connected to the drain electrode of the thin film transistor 70. The thin film transistor 70 is between the pixel definition layer 20 and the base substrate 10.

Optionally, a projection of the subpixel region 201 on the base substrate 10 overlaps with that of at least a portion of the first electrode 101. The organic layer 102 is disposed in the subpixel region 201. Optionally, a projection of the subpixel region 201 on the base substrate 10 overlaps with that of at least a portion of the second electrode 103.

Optionally, the thin film transistor 70 includes a gate electrode, a gate insulating layer, a semiconductor active layer, a source electrode and a drain electrode. Optionally, the thin film transistor is a bottom-gate thin file transistor (as shown in FIG. 7). Optionally, the thin film transistor is a top-gate thin film transistor.

The organic layer 102 includes an organic light emitting layer. Optionally, the organic layer further includes one or more electrode transport layers, one or more hole transport layers, one or more electron injection layers between a cathode (e.g., the second electrode 103) and an electron transport layer, and one or more hole injection layers between an anode (e.g., the first electrode 101) and a hole transport layer.

Various appropriate electrode materials may be used for making the first electrode 101. Optionally, the first electrode 101 is an anode. Optionally, the first electrode 101 is a cathode. Optionally, the first electrode 101 is made of a transparent electrode material. Optionally, the first electrode 101 is made of a metallic material. Optionally, the first electrode 101 includes a plurality of sub-layers laminated together, e.g., a transparent electrode sub-layer-a non-transparent electrode sub-layer-a transparent electrode sub-layer laminated together.

Various appropriate electrode materials may be used for making the second electrode 103. Optionally, the second electrode 103 is an anode. Optionally, the second electrode 103 is a cathode. Optionally, the second electrode 103 is made of a transparent electrode material. Optionally, the second electrode 103 is made of a metallic material.

In another aspect, the present disclosure provides an organic light emitting diode display panel having an organic light emitting diode display substrate described herein or fabricated by a method described herein. Optionally, the organic light emitting diode display panel further includes a counter substrate facing the organic light emitting diode display substrate. Optionally, the counter substrate is a color filter substrate.

In another aspect, the present disclosure provides an organic light emitting diode display apparatus. Examples of appropriate organic light emitting diode display apparatuses includes, but are not limited to, an electronic paper, a mobile phone, a tablet computer, a television, a monitor, a notebook computer, a digital album, a GPS, etc.

In another aspect, the present disclosure provides a method of fabricating the organic light emitting diode display substrate having a subpixel region and an inter-subpixel region. Referring to FIG. 3, the method in some embodiments includes forming a pixel definition layer 20 on the base substrate 10, the pixel definition layer 20 being formed in the inter-subpixel region 202 and defining the subpixel region 201 of the organic light emitting diode display substrate; and forming an insulating dielectric layer 50 on a side of the pixel definition layer 20 distal to the base substrate 10, the insulating dielectric layer 50 being formed to define a first aperture region 501 greater than the subpixel region 201. The insulating dielectric layer 50 is formed so that a width of the first aperture region 501 is neater than a width of the subpixel region 201, an edge of the pixel definition layer 20 surrounding the subpixel region 201 extends over an edge of the insulating dielectric layer 50 surrounding the first aperture region 501 by a width w1, as shown in FIG. 3. Optionally, the width of the first aperture region 501 is greater than a width of the subpixel region 201 by at least 1 μm.

In some embodiments, the method further includes, subsequent to forming the insulating dielectric layer, forming an organic light emitting layer in each subpixel region 201 using a mask plate placed on the insulating dielectric layer 50. Optionally, the step of forming the organic light emitting diode includes forming a first electrode 101 at least a portion of which is formed in the subpixel region 201, forming an organic layer 102 at least a portion of which is formed in the subpixel region 201, and forming a second electrode 103 at least a portion of which is formed in the subpixel region 201.

Referring to FIG. 4, the method in some embodiments includes first forming the insulating dielectric layer 50 before the step of forming the organic layer 102 and the step of forming the second electrode 103. Optionally, the organic layer 102 is formed using a mask plate 30 placed on the insulating dielectric layer 50.

Optionally, the pixel definition layer 20 and the insulating dielectric layer 50 are formed by one or more lithography processes. Optionally, the lithography process includes exposure, development, and etching steps.

In the present fabricating method, an insulating dielectric layer 50 is formed on the pixel definition layer 20 prior to forming the organic light emitting layer using a mask plate, the insulating dielectric layer 50 is formed so that a recess R is formed between the insulating dielectric layer 50 and the subpixel region 201 when a mask plate 30 is placed on the insulating dielectric layer 50, e.g., the edge of the mask plate 30 in the first aperture region 501 and surrounding the subpixel region 201 is not in contacted with the edge of the pixel definition layer 20 m the first aperture region 501 and surrounding the subpixel region 201. By having this design, even if the mask plate 30 is deformed and has a ragged edge, or the mask plate 30 moves relative to the base substrate 10 during or after the vapor deposition process, damages to the, layers of the organic light emitting diode can be obviated, because the mask plate 30 is not in contact with, e.g., spaced apart from, the edges of pixel definition layer 20 surrounding the, subpixel region 201. Further, damages caused by particles condensed onto the edge of the mask plate can also be avoided by having this design.

Optionally, the insulating dielectric layer is formed to have a thickness in a range of approximately 1 μm to approximately 5 μm to avoid shadowing effects during the vapor deposition process.

Referring to FIG. 5, the method in some embodiments further includes, prior to forming the organic light emitting layer, forming a protrusion layer including a plurality of protruding portions 60 in the inter-subpixel region 202, each of the plurality of protruding portions 60 being formed to substantially encircle a subpixel region 201. Each of the plurality of protruding portions 60 is formed to be spaced apart from the insulating dielectric layer 50 by a distance w2. A height h1 of each of the plurality of protruding portions 60 relative to the base substrate 10 is less than a height h2 of the insulating dielectric layer 50 relative to the base substrate 10.

The organic layer 102 (which includes the organic light emitting layer) is formed subsequent to the formation of the insulating dielectric layer 50 and the formation of the protrusion layer. Optionally, the second electrode 103 is formed subsequent to the formation of the organic layer 102.

Optionally, the pixel definition layer 20, the insulating dielectric layer 50, and the protrusion layer are formed by one or more lithography processes. Optionally, the lithography process includes exposure, development, and etching steps.

By having a protrusion layer including the plurality of protruding portions 60 each encircling a subpixel region 201, the mask plate 30 can be supported by the plurality of protruding portions 60 when the mask plate 30 is deformed and has a ragged edge, avoiding any direct contact between the mask plate 30 and the edges of pixel definition layer 20 surrounding the subpixel region 201. Moreover, the presence of the plurality of protruding portions 60 can prevent contaminating objects accumulated on the mask plate 30 from falling into the subpixel region 201 during the vapor deposition process when the mask plate 30 is placed on the insulating dielectric layer 50.

In some embodiments, the pixel definition layer 20, the insulating dielectric layer 50, and the protrusion layer are formed in separate patterning steps. In one example, the method includes forming the pixel definition layer 20 using a first mask plate having a pattern corresponding to the pixel definition layer 20 in a first lithography process. Optionally, the pixel definition layer 20 is formed using an organic material such as polyimide and phenolic resin. In another example, a first electrode 101 is first formed on the base substrate 10, an organic insulating material layer is then formed on the base substrate 10, a photoresist layer is formed on a side of the organic insulating material layer distal to the base substrate 10, exposing the photoresist layer using a first mask plate, developing the photoresist layer to obtain a photoresist pattern having a first region corresponding to the pixel definition layer 20 and a second region outside the first region, the photoresist material being removed in the second region exposing the organic insulating material layer underneath, and removing the organic insulating material in the second region thereby forming the pixel definition layer 20.

Next, the method further includes forming the insulating dielectric layer 50 using a second mask plate having a pattern corresponding to the insulating dielectric layer 50 in a second lithography process. Optionally, the insulating dielectric layer 50 is formed using an organic material such as polyimide and phenolic resin. Optionally, the insulating dielectric layer 50 is formed using an inorganic material such as aluminum oxide ($Al_2O_3$), zinc oxide (ZnO), and titanium dioxide ($TiO_2$). In another example, an insulating dielectric material layer is formed on the base substrate 10 having the pixel definition layer 20 pre-formed, a photoresist layer is formed on a side of the insulating dielectric material layer distal to the base substrate 10, exposing the photoresist layer using a second mask plate, developing the photoresist layer to obtain a photoresist pattern having a third region corresponding to the insulating dielectric layer 50 and a fourth region outside the third region, the photoresist material being removed in the fourth region exposing the insulating dielectric material layer underneath, and removing the insulating dielectric material in the fourth region thereby forming the insulating dielectric layer 50.

Next, the method further includes forming the protrusion layer using a third mask plate having a pattern corresponding to the protrusion layer in a third lithography process. Optionally, the protrusion layer is formed using an organic material such as polyimide and phenolic resin. Optionally, the protrusion layer is formed using an inorganic material such as aluminum oxide ($Al_2O_3$), zinc oxide (ZnO), and titanium dioxide ($TiO_2$). In another example, an insulating dielectric material layer is formed on the base substrate 10 having the pixel definition layer 20 and the insulating dielectric layer 50 pre-formed, a photoresist layer is formed on a side of the insulating dielectric material layer distal to the base substrate 10, exposing the photoresist layer using a third mask plate, developing the photoresist layer to obtain a photoresist pattern having a fifth region corresponding to the protrusion layer and a sixth region outside the fifth region, the photoresist material being removed in the sixth region exposing the insulating dielectric material layer underneath, and removing the insulating dielectric material in the sixth region thereby forming the protrusion layer.

In some embodiments, the insulating dielectric layer 50 and the protrusion layer are formed in a single process using a same mask plate and a same material, but the pixel definition layer 20 is formed in a separate patterning step. In one example, the method includes forming the pixel definition layer 20 using a first mask plate having a pattern corresponding to the pixel definition layer 20 in a first lithography process. Optionally, the pixel definition layer 20 is formed using an organic material such as polyimide and phenolic resin. In another example, a first electrode 101 is first formed on the base substrate 10, an organic insulating material layer is then formed on the base substrate 10, a photoresist layer is formed on a side of the organic insulating material layer distal to the base substrate 10, exposing the photoresist layer using a first mask plate, developing the photoresist layer to obtain a photoresist pattern having a first region corresponding to the pixel definition layer 20 and a second region outside the first region, the photoresist material being removed in the second region exposing the organic insulating material layer underneath, and removing the organic insulating material in the second region thereby forming the pixel definition layer 20.

Figure 8A:
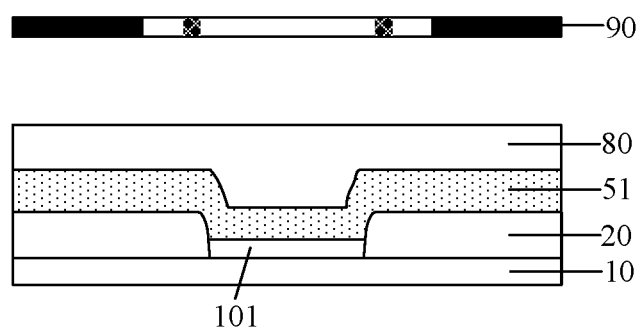
FIGS. 8A to 8D illustrate a process of forming an insulating dielectric layer and a protrusion layer in some embodiments according to the present disclosure.
Figure 8B:
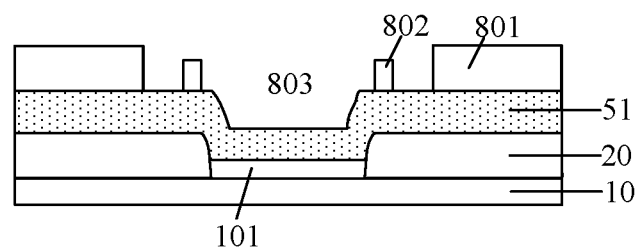
Figure 8C:
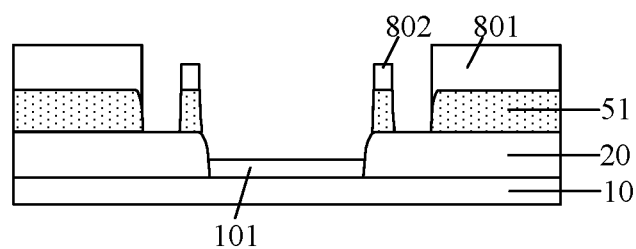
Figure 8D:
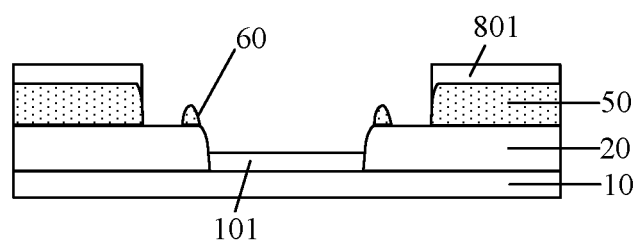

Next, the method further includes forming the insulating dielectric layer 50 and the protrusion layer using a first half-tone or gray-tone mask plate in a single lithography process. FIGS. 8A to 8D illustrate a process of forming an insulating dielectric layer and a protrusion layer in some embodiments according to the present disclosure. Referring to FIG. 8A, the method in some embodiments includes forming a first insulating dielectric material layer 51 on the base substrate 10 having the pixel definition layer 20 and the first electrode 101 pre-formed, forming a photoresist layer 80 on a side of the first insulating dielectric material layer 51 distal to the base substrate 10, exposing the photoresist layer 80 with a first half-tone or gray-tone mask plate, and developing the exposed photoresist layer to obtain a photoresist pattern as shown in FIG. 8B. The photoresist pattern has a first region 801 corresponding to the insulating dielectric layer 50 to be formed, a second region 802 corresponding to the protrusion layer to be formed, and a third region 803 outside the first region 801 and the second region 802, the first section 801 being substantially unexposed, the second section 802 being partially exposed, the third section 803 being fully exposed, and the photoresist material being removed in the third section 803. Referring to FIG. 8C, the method in some embodiments further includes removing (e.g., etching) the first insulating dielectric material layer 51 in the third section 803. Referring to FIG. 8D, the method in some embodiments further includes removing (e.g., ashing) the photoresist layer in the second section 802 while maintaining the photoresist layer in the first section 801, thereby exposing the first insulating dielectric material layer 51 in the second section 802; and partially removing the first insulating dielectric material layer 51 in the second section 802, thereby forming the protrusion layer. Optionally, the method further includes removing the photoresist layer in the first region 801.

Optionally, the first insulating dielectric material is an organic material. Optionally, the first insulating dielectric material is an inorganic material.

Optionally, the first insulating dielectric material is an organic photoresist material. Optionally, when the first insulating dielectric material layer 51 is made of an organic photoresist material, a photoresist layer 80 is not necessary. The method in that case includes exposing the first insulating dielectric material layer 51 with the first half-tone or gray-tone mask plate to obtain the photoresist pattern.

Figure 9A:
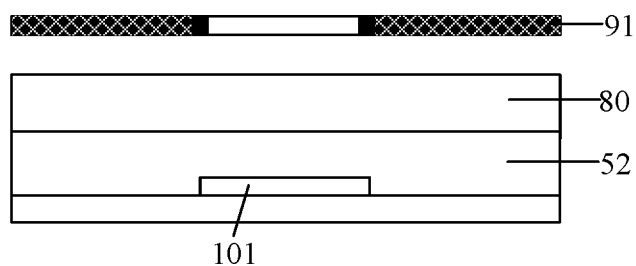
FIGS. 9A to 9D illustrate a process of forming a pixel definition layer and a protrusion layer in some embodiments according to the present disclosure.
Figure 9B:
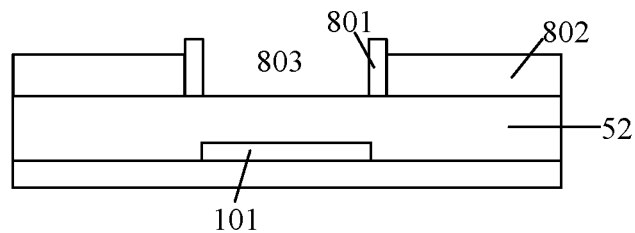
Figure 9C:
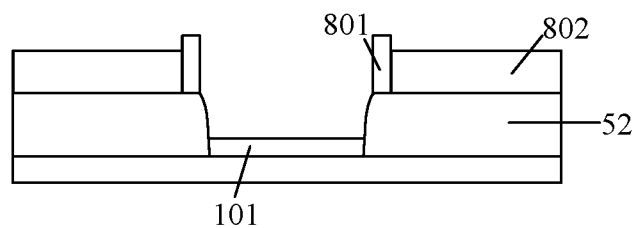
Figure 9D:
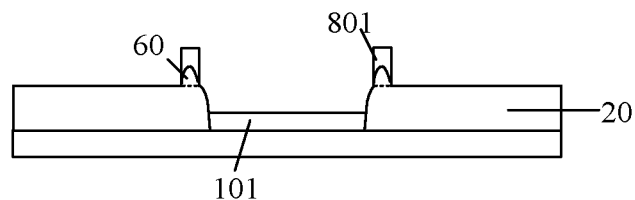

In some embodiments, the pixel definition layer 20 and the protrusion layer are formed in a single process using a same mask plate and a same material, but the insulating dielectric layer 50 is formed in a separate patterning step. FIGS. 9A to 9D illustrate a process of forming a pixel definition layer and a protrusion layer in sonic embodiments according to the present disclosure. Referring to FIG. 9A, the method in some embodiments includes forming a second insulating dielectric material layer 52 on the base substrate 10 having the first electrode 101 pre-formed, forming a photoresist layer 80 on a side of the second insulating dielectric material layer 52 distal to the base substrate 10, exposing the photoresist layer 80 with a second half-tone or gray-tone mask plate 91, and developing the exposed photoresist layer to obtain a photoresist pattern as shown in FIG. 9B. The photoresist pattern has a first region 801 corresponding to the protrusion layer, a second region 802 corresponding to the pixel definition layer other than the first region 801, and a third region 803 outside the first region 801 and the second region 802, and the first section 801 being substantially unexposed, the second section 802 being partially exposed, the third section 803 being fully exposed, and the photoresist material being removed in the third section 803. Referring to FIG. 9C, the method in some embodiments further includes removing (e.g., etching) the second insulating dielectric material layer 52 in the third section 803. Referring to FIG. 9D the method in some embodiments further includes removing (e.g., ashing) the photoresist layer in the second section 802 while maintaining the photoresist layer in the first section 801, thereby exposing the second insulating dielectric material layer 52 in the second section 802; and partially removing the second insulating dielectric material layer 52 in the second section 802, thereby forming the pixel definition layer 20 and the protrusion layer. Optionally, the method further includes removing the photoresist layer in the first region 801.

Optionally, the second insulating dielectric material is an organic material. Optionally, the second insulating dielectric material is an inorganic material.

Optionally, the second insulating dielectric material is an organic photoresist material. Optionally, when the second insulating dielectric material layer 52 is made of an organic photoresist material, a photoresist layer 80 is not necessary. The method in that case includes exposing the second insulating dielectric material layer 52 with a half-tone mask plate or a gray-tone mask plate to obtain the photoresist pattern.

Next, the method further includes forming the insulating dielectric layer 50 using a second mask plate having a pattern corresponding to the insulating dielectric layer 50 in a second lithography process. Optionally, the insulating dielectric layer 50 is formed using an organic material such as polyimide and phenolic resin. Optionally, the insulating dielectric layer 50 is formed using an inorganic material such as aluminum oxide ($Al_2O_3$), zinc oxide (ZnO), and titanium dioxide ($TiO_2$). In another example, an insulating dielectric material layer is formed on the base substrate 10 having the pixel definition layer 20 and the protrusion layer pre-formed as discussed above, a photoresist layer is formed on a side of the insulating dielectric material layer distal to the base substrate 10, exposing the photoresist layer using a second mask plate, developing the photoresist layer to obtain a photoresist pattern having a first region corresponding to the insulating dielectric layer 50 and a second region outside the first region, the photoresist material being removed in the second region exposing the insulating dielectric material layer underneath, and removing the insulating dielectric material in the second region thereby forming the insulating dielectric layer 50.

In some embodiments, the pixel definition layer 20 and the insulating dielectric layer 50 are formed in a single process using a same mask plate and a same material, but the protrusion layer is formed in a separate patterning step. In one example, the method includes forming a third insulating dielectric material layer on the base substrate 10 having the first electrode 101 pre-formed, forming a photoresist layer on a side of the third insulating dielectric material layer distal to the base substrate 10, exposing the photoresist layer with a third half-tone or gray-tone mask plate, and developing the exposed photoresist layer to obtain a photoresist pattern. The photoresist pattern has a first region corresponding to the insulating dielectric layer 50, a second region corresponding to the pixel definition layer other than the first region, and a third region outside the first region and the second region, and the first section being substantially unexposed, the second section being partially exposed, the third section being fully exposed, and the photoresist material being removed in the third section. Optionally, the method further includes removing (e.g., etching) the third insulating dielectric material layer in the third section. Optionally, the method further includes removing ashing) the photoresist layer in the second section while maintaining the photoresist layer in the first section, thereby exposing the third insulating dielectric material layer in the second section; and partially removing the third insulating dielectric material layer in the second section, thereby forming the pixel definition layer 20 and the insulating dielectric layer 50. Optionally, the method further includes removing the photoresist layer in the first region.

Next, the method further includes forming the protrusion layer using a third mask plate having a pattern corresponding to the protrusion layer in a third lithography process. Optionally, the protrusion layer is formed using an organic material such as polyimide and phenolic resin. Optionally, the protrusion layer is formed using an inorganic material such as aluminum oxide ($Al_2O_3$), zinc oxide (ZnO), and titanium dioxide ($TiO_2$). In one example, an insulating dielectric material layer is formed on the base substrate 10 having the pixel definition layer 20 and the insulating dielectric layer 50 pre-formed, a photoresist layer is formed on a side of the insulating dielectric material layer distal to the base substrate 10, exposing the photoresist layer using a third mask plate, developing the photoresist layer to obtain a photoresist pattern having a first region corresponding to the protrusion layer and a second region outside the first region, the photoresist material being removed in the second region exposing the insulating dielectric material layer underneath, and removing the insulating dielectric material in the second region thereby forming the protrusion layer.

Figure 10A:
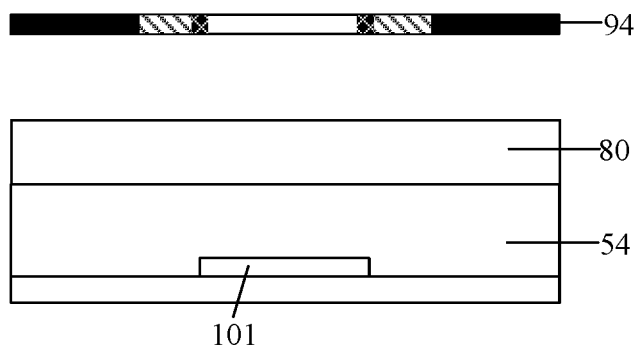
FIGS. 10A to 10E illustrate a process of forming a pixel definition layer, an insulating dielectric layer, and a protrusion layer in some embodiments according to the present disclosure.
Figure 10B:
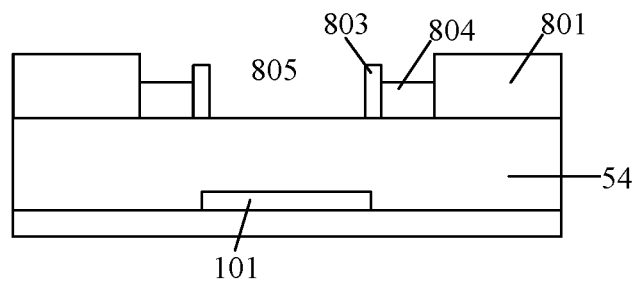
Figure 10C:
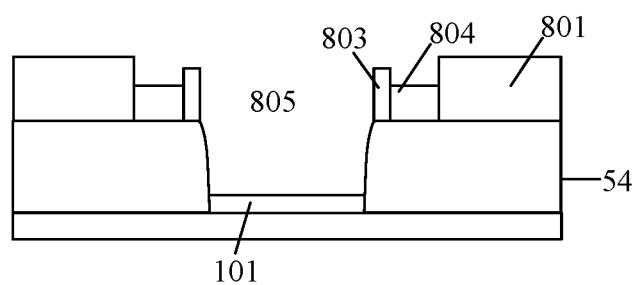
Figure 10D:
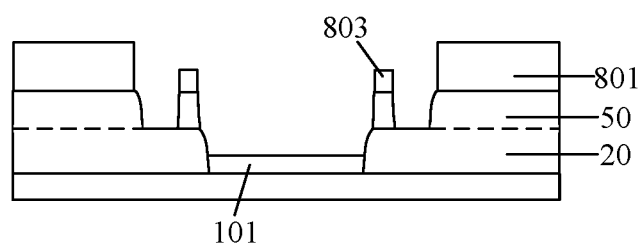
Figure 10E:
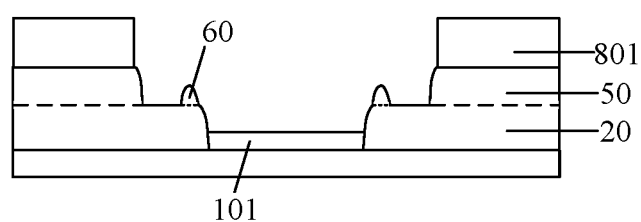

In some embodiments, the pixel definition layer 20, the insulating dielectric layer 50, and the protrusion layer are all formed in a single process using a same mask plate and a same material. FIGS. 10A to 10E illustrate a process of forming a pixel definition layer, an insulating dielectric layer, and a protrusion layer in some embodiments according to the present disclosure. Referring to FIG. 10A, the method in some embodiments includes forming a fourth insulating dielectric material layer 54 on the base substrate 10 having the first electrode 101 pre-formed, forming a photoresist layer 80 on a side of the fourth insulating dielectric material layer 54 distal to the base substrate 10, exposing the photoresist layer 80 with a fourth half-tone or gray-tone mask plate 94, and developing the exposed photoresist layer to obtain a photoresist pattern as shown in FIG. 10B. The photoresist pattern has a first region 801 corresponding to the insulating dielectric layer 50, a second region 803 corresponding to the protrusion layer, a third region 804 corresponding to the pixel definition layer 20 other than the first region 801 and the second region 803, and a fourth region 805 outside the first region 801, the second region 803, and the third region 804. The first section 801 is substantially unexposed, the second section 803 is a first partially exposed region, the third section 804 is a second partially exposed region, the fourth section 805 is fully exposed. The photoresist material is removed in the fourth section 805. The second region 803 has a thickness greater than the third region 804. Referring to FIG. 10C, the method in some embodiments further includes removing (e.g., etching) the fourth insulating dielectric material layer 54 in the fourth section 805. Referring to FIG. 10D, the method in some embodiments further includes removing (e.g., ashing) the photoresist layer in the third section 804 while maintaining the photoresist layer in the first section 801 and the second section 803, thereby exposing the fourth insulating dielectric material layer 54 in the third section 804; and removing the fourth insulating dielectric material layer 54 in the third section 804, thereby forming the pixel definition layer 20 and the insulating dielectric layer 50. Referring to FIG. 10E, the method in some embodiments further includes removing (e.g., asking) the photoresist layer in the second region 803 while maintaining the photoresist layer in the first section 801, thereby exposing the fourth insulating dielectric material layer 54 in the second region 803; and partially removing the fourth insulating dielectric material layer 54 in the second region 803, thereby forming the protrusion layer. Optionally, the method further includes removing the photoresist layer in the first region 801.

Optionally, the fourth insulating dielectric material is an organic material. Optionally, the fourth insulating dielectric material is an inorganic material.

Optionally, the fourth insulating dielectric material is an organic photoresist material. Optionally, when the fourth insulating dielectric material layer 54 is made of an organic photoresist material, a photoresist layer 80 is not necessary. The method in that case includes exposing the fourth insulating dielectric material layer 54 with a half-tone mask plate or a gray-tone mask plate to obtain the photoresist pattern.

In some embodiments, the method further includes forming an organic layer 102 on a side of the first electrode 101 distal to the base substrate 10, and forming a second electrode 103 on a side of the organic layer 102 distal to the first electrode 101. Optionally, the organic layer 102 is formed in a vapor deposition process. Optionally, the second electrode 103 is formed in a vapor deposition process. Optionally, the step of forming the organic layer 102 includes forming an organic light emitting layer.

In some embodiments, the method further includes forming a thin film transistor 70. Optionally, the thin film transistor 70 is formed between the base substrate 10 and the pixel definition layer 20. Optionally, the thin film transistor 70 is formed so that the drain electrode of the thin film transistor 70 is electrically connected to the first electrode 101 (e.g., an anode of the organic light emitting diode).

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A method of fabricating an organic light emitting diode display substrate having a subpixel region and an inter-subpixel region, comprising:
    forming a pixel definition layer on a base substrate, the pixel definition layer being formed in the inter-subpixel region and defining the subpixel region of the organic light emitting diode display substrate;
    forming an insulating dielectric layer on a side of the pixel definition layer distal to the base substrate, the insulating dielectric layer being formed to define a first aperture region greater than the subpixel region, an edge of a portion of the insulating dielectric layer formed substantially surrounding the first aperture region;
    forming a protrusion layer comprising a plurality of protruding rings in the inter-subpixel region, a respective one of the plurality of protruding rings formed as a ring structure substantially encircling the subpixel region; and
    subsequent to forming the insulating dielectric layer and forming the protrusion layer, forming an organic light emitting layer in a respective subpixel region using a mask plate placed on the insulating dielectric layer;
    wherein the pixel definition layer and the insulating dielectric layer are formed so that a projection of the first aperture region on the base substrate covers that of the subpixel region;
    the mask plate has a plurality of apertures, an edge of each of the plurality of apertures surrounding the subpixel region;
    the respective one of the plurality of protruding rings is formed to be spaced apart from the insulating dielectric layer, thereby forming a recess between the respective one of the plurality of protruding rings and the insulating dielectric layer;
    a height of the protrusion layer relative to the base substrate is less than that of the insulating dielectric layer;
    a portion of the mask plate in the first aperture region and surrounding the subpixel region is spaced apart by a gap from a portion of the pixel definition layer in the first aperture region and surrounding the subpixel region;
    the respective one of the plurality of protruding rings is between two portions of the recess in a cross-section of the organic light emitting diode display substrate along a plane intersecting each of the base substrate, the pixel definition layer, and the insulating dielectric layer;
    the respective one of the plurality of protruding rings and the two portions of the recess are between two portions of the insulating dielectric layer in the cross-section of the organic light emitting diode display substrate along the plane intersecting each of the base substrate, the pixel definition layer, and the insulating dielectric layer;
    in a same inter-subpixel region between two directly adjacent subpixel regions, a portion of the insulating dielectric layer is between two recesses in the same inter-subpixel region, along the plane intersecting each of the base substrate, the pixel definition layer, and the insulating dielectric layer; and
    in the same inter-subpixel region between two directly adjacent subpixel regions, the portion of the insulating dielectric layer is between two portions in the same inter-subpixel region and respectively from two of the plurality of protruding rings respectively surrounding the two directly adjacent subpixel regions, along the plane intersecting each of the base substrate, the pixel definition layer, and the insulating dielectric layer.

2. The method of claim 1, wherein the gap has a thickness substantially the same as that of the insulating dielectric layer.

3. The method of claim 1, wherein each of the plurality of protruding rings is formed to define a second aperture region;
    the projection of the first aperture region on the base substrate covers that of the second aperture region; and
    a projection of the second aperture region on the base substrate substantially overlaps with that of the subpixel region encircled by one of the plurality of protruding rings.

4. The method of claim 1, wherein a width of the first aperture region is greater than a width of the subpixel region by at least 1µm.

5. The method of claim 1, wherein the pixel definition layer and the insulating dielectric layer are formed in a single process using a same material and a same mask plate.

6. The method of claim 1, wherein the pixel definition layer and the protrusion layer are formed in a single process using a same material and a same mask plate.

7. The method of claim 1, wherein the insulating dielectric layer and the protrusion layer are formed in a single process using a same material and a same mask plate.

8. The method of claim 1, wherein the pixel definition layer, the insulating dielectric layer, and the protrusion layer are formed in a single process using a same material and a same mask plate.

9. The method of claim 1, further comprising forming a thin film transistor in the inter-subpixel region;
    forming a first electrode on the base substrate;
    forming an organic layer on a side of the first electrode distal to the base substrate; and
    forming a second electrode on a side of the organic layer distal to the first electrode;
    wherein forming the thin film transistor comprises forming a drain electrode; and
    the drain electrode is formed to be electrically connected to the first electrode of an organic light emitting diode.

10. An organic light emitting diode display substrate having a subpixel region and an inter-subpixel region, comprising:
    a base substrate;
    a pixel definition layer in the inter-subpixel region and defining the subpixel region of the organic light emitting diode display substrate;
    an insulating dielectric layer on a side of the pixel definition layer distal to the base substrate, defining a first aperture region greater than the subpixel region, an edge of a portion of the insulating dielectric layer substantially surrounding the first aperture region; and
    a protrusion layer comprising a plurality of protruding rings in the inter-subpixel region, a respective one of the plurality of protruding rings being a ring structure substantially encircling the subpixel region;

wherein a projection of the first aperture region on the base substrate covers that of the subpixel region;

the respective one of the plurality of protruding rings is spaced apart from the insulating dielectric layer, thereby forming a recess between the respective one of the plurality of protruding rings and the insulating dielectric layer;

a height of the protrusion layer relative to the base substrate is less than that of the insulating dielectric layer;

the respective one of the plurality of protruding rings is between two portions of the recess in a cross-section of the organic light emitting diode display substrate along a plane intersecting each of the base substrate, the pixel definition layer, and the insulating dielectric layer;

the respective one of the plurality of protruding rings and the two portions of the recess are between two portions of the insulating dielectric layer in the cross-section of the organic light emitting diode display substrate along the plane intersecting each of the base substrate, the pixel definition layer, and the insulating dielectric layer;

in a same inter-subpixel region between two directly adjacent subpixel regions, a portion of the insulating dielectric layer is between two recesses in the same inter-subpixel region, along the plane intersecting each of the base substrate, the pixel definition layer, and the insulating dielectric layer; and in the same inter-subpixel region between two directly adjacent subpixel regions, the portion of the insulating dielectric layer is between two portions in the same inter-subpixel region and respectively from two of the plurality of protruding rings respectively surrounding the two directly adjacent subpixel regions, along the plane intersecting each of the base substrate, the pixel definition layer, and the insulating dielectric layer.

11. The organic light emitting diode display substrate of claim 10, wherein the insulating dielectric layer abuts the pixel definition layer.

12. The organic light emitting diode display substrate of claim 10, wherein the insulating dielectric layer is an integral portion of the pixel definition layer.

13. The organic light emitting diode display substrate of claim 10, wherein each of the plurality of protruding rings defines a second aperture region;

a projection of the first aperture region on the base substrate covers that of the second aperture region; and a projection of the second aperture region on the base substrate substantially overlaps with that of the subpixel region encircled by one of the plurality of protruding rings.

14. The organic light emitting diode display substrate of claim 10, wherein the protrusion layer abuts the pixel definition layer.

15. The organic light emitting diode display substrate of claim 10, wherein the protrusion layer is an integral portion of the pixel definition layer.

16. The organic light emitting diode display substrate of claim 10, further comprising a thin film transistor in the inter-subpixel region and an organic light emitting diode;

wherein the organic light emitting diode comprises:

a first electrode on the base substrate;

an organic layer on a side of the first electrode distal to the base substrate;

a second electrode on a side of the organic layer distal to the first electrode; and the organic layer comprises an organic light emitting layer;

wherein the thin film transistor comprises a drain electrode electrically connected to the first electrode of the organic light emitting diode.

17. The organic light emitting diode display substrate of claim 10, wherein the insulating dielectric layer has a thickness in a range of approximately 1μm to approximately 5μm.

18. An organic light emitting diode display apparatus, comprising the organic light emitting diode display substrate of claim 10.

* * * * *